US010786981B2

(12) United States Patent
Askin et al.

(10) Patent No.: US 10,786,981 B2
(45) Date of Patent: Sep. 29, 2020

(54) MASKING AND DE-MASKING SYSTEMS AND PROCESSES

(71) Applicant: HZO, Inc., Draper, UT (US)

(72) Inventors: Robert Askin, Salt Lake City, UT (US); Joshua Su, Draper, UT (US); Melon Yu, Shenzhen (CN); Alex Anderson, Draper, UT (US); Wei Li, Shenzhen (CN); Wan-Man Liu, Shenzhen (CN); Zhi-Guang Chen, Shenzhen (CN)

(*) Notice: Subject to any disclaimer, the term of this patent is extended or adjusted under 35 U.S.C. 154(b) by 0 days.

(21) Appl. No.: 15/644,610

(22) Filed: Jul. 7, 2017

(65) Prior Publication Data

US 2018/0117893 A1    May 3, 2018

Related U.S. Application Data

(60) Provisional application No. 62/359,548, filed on Jul. 7, 2016.

(51) Int. Cl.
| | | |
|---|---|---|
| B32B 37/00 | (2006.01) | |
| H05K 13/04 | (2006.01) | |
| H05K 3/00 | (2006.01) | |
| B05C 5/00 | (2006.01) | |
| B05C 9/06 | (2006.01) | |
| B05C 13/00 | (2006.01) | |
| B32B 7/12 | (2006.01) | |
| B32B 37/02 | (2006.01) | |

(52) U.S. Cl.
CPC ............ *B32B 37/0046* (2013.01); *B05C 5/00* (2013.01); *B05C 9/06* (2013.01); *B05C 13/00* (2013.01); *B32B 7/12* (2013.01); *B32B 37/02* (2013.01); *H05K 3/0079* (2013.01); *H05K 13/0469* (2013.01); *B32B 2457/00* (2013.01)

(58) Field of Classification Search
CPC .................................................. B32B 37/0046
See application file for complete search history.

(56) References Cited

U.S. PATENT DOCUMENTS

| | | | | |
|---|---|---|---|---|
| 2013/0176691 A1* | 7/2013 | Stevens | ..................... | H05K 3/28 361/748 |
| 2014/0190931 A1* | 7/2014 | Astle | ....................... | B24C 3/322 216/13 |
| 2015/0170947 A1* | 6/2015 | Bluck | ............... | H01L 21/67173 414/217 |

OTHER PUBLICATIONS

Thomas "International Search Report for Application No. PCT/US17/41239" dated Nov. 3, 2017, 4 pages.

(Continued)

*Primary Examiner* — Daniel H Lee
(74) *Attorney, Agent, or Firm* — Intellectual Strategies

(57) ABSTRACT

An automated masking system includes a substrate loading apparatus designed to hold a plurality of substrates, a first masking material application station designed to automatically apply a first masking material to a portion of the substrate, and a second masking material application station designed to automatically apply a second masking material to a portion of the substrate, the second masking material being different than the first masking material. The system includes a first dispensing apparatus and a second dispensing apparatus that move relative to the substrate in a repeatable motion. The substrate moves automatically from the first masking material application station to the second masking material application station.

15 Claims, 10 Drawing Sheets

(56) References Cited

OTHER PUBLICATIONS

Thomas "Written Opinion of the International Searching Authority for Application No. PCT/US17/41239" dated Nov. 3, 2017, 6 pages.

* cited by examiner

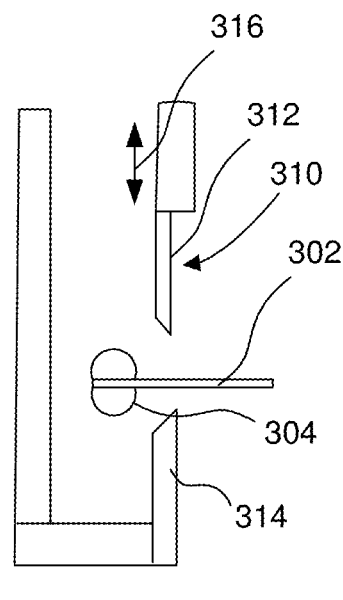
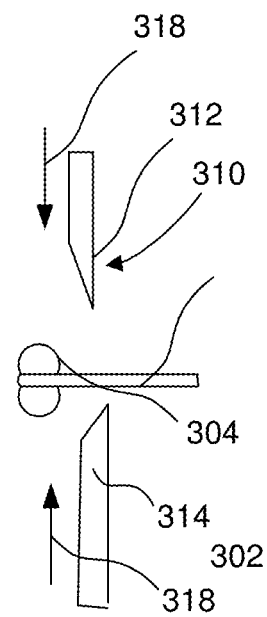
FIG. 11A　　　　FIG. 11B
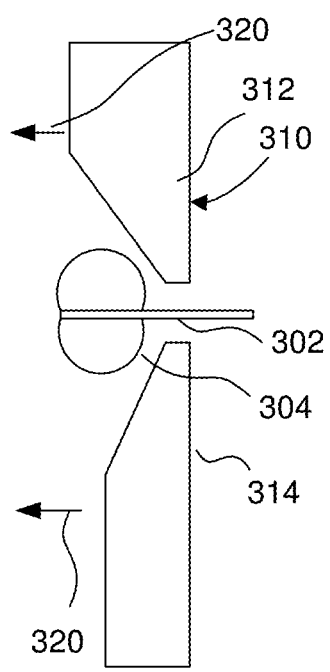
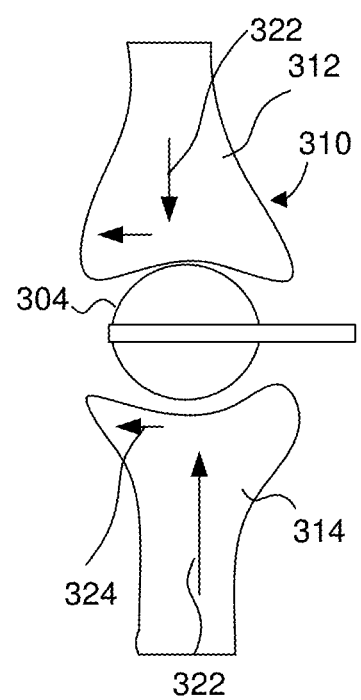
FIG. 11C　　　　FIG. 11D

MASKING AND DE-MASKING SYSTEMS AND PROCESSES

RELATED APPLICATIONS

This application claims priority to U.S. provisional application 62/359,548 entitled "Masking and De-Masking System and Processes" and filed on 7 Jul. 2016. The above application is incorporated herein by reference in its entirety

BACKGROUND

This disclosure relates generally to methods and systems for applying masking materials to and removing masking materials from selected areas of substrates, such as electronic devices and subassemblies. More specifically, this disclosure relates to automated masking and de-masking processes for electronic devices before and after the application of protective coatings to the electronic devices.

SUMMARY

The subject matter of the present application has been developed in response to the present state of the art, and in particular, in response to the problems and disadvantages associated with conventional protective coatings that have not yet been fully solved by currently available techniques. Accordingly, the subject matter of the present application has been developed to provide embodiments of a system, an apparatus, and a method that overcome at least some of the shortcomings of prior art techniques.

Disclosed herein is an automated masking system. The system includes a substrate loading apparatus designed to hold a plurality of substrates, a first masking material application station designed to automatically apply a first masking material to a portion of the substrate, and a second masking material application station designed to automatically apply a second masking material to a portion of the substrate, the second masking material being different than the first masking material. The system includes a first dispensing apparatus and a second dispensing apparatus that move relative to the substrate in a repeatable motion. The substrate moves automatically from the first masking material application station to the second masking material application station. The preceding subject matter of this paragraph characterizes example 1 of the present disclosure.

The first dispensing apparatus dispenses a tape. The preceding subject matter of this paragraph characterizes example 2 of the present disclosure, wherein example 2 also includes the subject matter according to example 1, above.

The second dispensing apparatus dispensing apparatus dispenses a hot glue. The preceding subject matter of this paragraph characterizes example 3 of the present disclosure, wherein example 3 also includes the subject matter according to any one of examples 1-2, above.

The first dispensing apparatus dispenses a grease. The preceding subject matter of this paragraph characterizes example 4 of the present disclosure, wherein example 4 also includes the subject matter according to any one of examples 1 or 3, above.

The first dispensing apparatus moves relative to the substrate in a repeatable motion via an X-Y table. The preceding subject matter of this paragraph characterizes example 5 of the present disclosure, wherein example 5 also includes the subject matter according to any one of examples 1-4, above.

The system further includes a conveyor apparatus configured to automatically move the substrate from the first masking material application station to the second masking material application station after application of the first masking material to the portion of the substrate. The preceding subject matter of this paragraph characterizes example 6 of the present disclosure, wherein example 6 also includes the subject matter according to any one of examples 1-5, above.

The system further includes a function tester configured to inspect the substrate. The preceding subject matter of this paragraph characterizes example 7 of the present disclosure, wherein example 7 also includes the subject matter according to any one of examples 1-6, above.

The second dispensing apparatus moves relative to the substrate in a repeatable motion via an X-Y table. The preceding subject matter of this paragraph characterizes example 8 of the present disclosure, wherein example 8 also includes the subject matter according to any one of examples 1-7, above.

Disclosed herein is an automated masking method. The method includes loading a plurality of substrates into a loading apparatus, automatically moving the substrates from the loading apparatus to a first masking material application station, applying a first masking material to the substrates from a first dispensing apparatus that moves relative to the substrates in a repeatable motion, automatically moving the substrates from the first masking material application station to a second masking material application station, and applying a second masking material to the substrates from a second dispensing apparatus that moves relative to the substrates in a repeatable motion. The preceding subject matter of this paragraph characterizes example 9 of the present disclosure.

The method includes inspecting the substrates after applying the first masking material and the second masking material. The preceding subject matter of this paragraph characterizes example 10 of the present disclosure, wherein example 10 also includes the subject matter according to example 9, above.

The first dispensing apparatus moves relative to the substrates in a repeatable motion programmed into an X-Y table. The preceding subject matter of this paragraph characterizes example 11 of the present disclosure, wherein example 11 also includes the subject matter according to any one of examples 9-10, above.

The second dispensing apparatus moves relative to the substrates in a repeatable motion programmed into an X-Y table. The preceding subject matter of this paragraph characterizes example 12 of the present disclosure, wherein example 12 also includes the subject matter according to any one of examples 9-11, above.

Applying the first masking material to the substrates from the first dispensing apparatus that moves relative to the substrates in the repeatable motion includes applying a tape. The preceding subject matter of this paragraph characterizes example 13 of the present disclosure, wherein example 13 also includes the subject matter according to any one of examples 9-12, above Applying the first masking material to the substrates from the first dispensing apparatus that moves relative to the substrates in the repeatable motion includes applying a hot glue. The preceding subject matter of this paragraph characterizes example 14 of the present disclosure, wherein example 14 also includes the subject matter according to any one of examples 9-12, above.

Applying the first masking material to the substrates from the first dispensing apparatus that moves relative to the substrates in the repeatable motion includes applying a grease. The preceding subject matter of this paragraph characterizes example 15 of the present disclosure, wherein example 15 also includes the subject matter according to any one of examples 9-12, above Disclosed herein is an automated system for removing bubbles formed in a tape mask. The system includes fixture configured to hold a substrate comprising a tape mask. The system further includes press tool apparatus configured to move relative to the fixture. The press tool apparatus includes at least one press tool and the press tool includes a flexible head and a buffer structure including an internal spring. The press tool apparatus is configured to locate the flexible head in engagement with the tape mask of the substrate and, while engaged with the tape mask, move the flexible head transversely relative to the tape mask. The preceding subject matter of this paragraph characterizes example 16 of the present disclosure.

The press tool apparatus further includes a robotic movable arm configured to move the at least one press tool relative to the substrate. The preceding subject matter of this paragraph characterizes example 17 of the present disclosure, wherein example 17 also includes the subject matter according to example 16, above.

The press tool apparatus moves relative to the substrate automatically. The preceding subject matter of this paragraph characterizes example 18 of the present disclosure, wherein example 18 also includes the subject matter according to any one of examples 16-17, above.

The fixture further includes features configured to hold the substrate from a back side of the substrate. The preceding subject matter of this paragraph characterizes example 19 of the present disclosure, wherein example 19 also includes the subject matter according to any one of examples 16-18, above.

The press tool apparatus is moved manually. The preceding subject matter of this paragraph characterizes example 20 of the present disclosure, wherein example 20 also includes the subject matter according to any one of examples 16, 18-19, above.

Disclosed herein is a method of removing bubbles formed in a tape mask. The method includes holding a substrate including a tape mask in a fixture, and applying a press tool against the tape mask. The press tool includes a flexible head and a buffer structure, including an internal spring. The method includes moving the press tool across the tape mask in a direction transverse to the substrate while the press tool is applied to the tape mask. The preceding subject matter of this paragraph characterizes example 21 of the present disclosure.

The press tool is attached to a robotic movable arm configured to move the press tool relative to the substrate. The preceding subject matter of this paragraph characterizes example 22 of the present disclosure, wherein example 22 also includes the subject matter according to example 21, above.

Moving the press tool across the tape mask in a direction transverse to the substrate includes moving the press tool manually. The preceding subject matter of this paragraph characterizes example 23 of the present disclosure, wherein example 23 also includes the subject matter according to any one of examples 21-22, above.

Moving the press tool across the tape mask in a direction transverse to the substrate includes moving the press tool in an automated manner. The preceding subject matter of this paragraph characterizes example 24 of the present disclosure, wherein example 24 also includes the subject matter according to any one of examples 21-22, above.

The method includes moving the press tool across the tape mask in a direction transverse to the substrate while the internal spring is compressed. The preceding subject matter of this paragraph characterizes example 25 of the present disclosure, wherein example 25 also includes the subject matter according to any one of examples 21-24, above.

Disclosed herein is an automated system for removing a masking material from a substrate. The system includes a fixture configured to hold a substrate including a masking material, and a removal tool configured to move relative to the fixture while applying a force to the masking material. The preceding subject matter of this paragraph characterizes example 26 of the present disclosure.

The force is one of a compressive forces or a shear force. The preceding subject matter of this paragraph characterizes example 27 of the present disclosure, wherein example 27 also includes the subject matter according to example 26, above.

The removal tool further comprises a heating element. The preceding subject matter of this paragraph characterizes example 28 of the present disclosure, wherein example 28 also includes the subject matter according to any one of examples 26-27, above.

The removal tool further includes an upper removal tool configured to engage an upper surface of the substrate and a lower removal tool configured to engage a lower surface of the substrate. The preceding subject matter of this paragraph characterizes example 29 of the present disclosure, wherein example 29 also includes the subject matter according to any one of examples 26-28, above.

The upper removal tool and the lower removal tool are coaxially aligned. The preceding subject matter of this paragraph characterizes example 30 of the present disclosure, wherein example 30 also includes the subject matter according to example 29, above.

The fixture is configured to hold the substrate between the upper removal tool and the lower removal tool. The preceding subject matter of this paragraph characterizes example 31 of the present disclosure, wherein example 31 also includes the subject matter according to any one of examples 29-30, above.

The substrate includes the masking material on the upper surface of the substrate and lower surface of the substrate. The preceding subject matter of this paragraph characterizes example 32 of the present disclosure, wherein example 32 also includes the subject matter according to any one of examples 29-31, above.

The removal tool comprises one of an annular tube or a blade. The preceding subject matter of this paragraph characterizes example 33 of the present disclosure, wherein example 33 also includes the subject matter according to any one of examples 26-32, above.

Disclosed herein is a method of removing a masking material from a substrate. The method includes holding a substrate including a masking material in a fixture, moving a removal tool relative to the fixture to engage the masking material with the removal tool, and while applying a force to the masking material, moving the removal tool relative to fixture. The preceding subject matter of this paragraph characterizes example 34 of the present disclosure.

The removal tool further includes an upper removal tool configured to engage an upper surface of the substrate and a lower removal tool configured to engage a lower surface of the substrate The preceding subject matter of this paragraph characterizes example 35 of the present disclosure, wherein example 35 also includes the subject matter according to example 34, above.

The method further includes moving the upper removal tool in a first direction and the lower removal tool in a second direction, opposite the first direction. The upper removal tool and the lower removal tool pinch the substrate. The preceding subject matter of this paragraph characterizes example 36 of the present disclosure, wherein example 36 also includes the subject matter according to example 35, above.

The method further includes while pinched, moving the upper removal tool and the lower removal tool in a third direction perpendicular to the first direction and the second direction. The preceding subject matter of this paragraph characterizes example 37 of the present disclosure, wherein example 37 also includes the subject matter according to example 36, above.

The removal tool further includes a heating element. The method further includes applying heat to the masking material during removal of the masking material. The preceding subject matter of this paragraph characterizes example 38 of the present disclosure, wherein example 38 also includes the subject matter according to any one of examples 34-37, above.

The removal tool includes a blade. The preceding subject matter of this paragraph characterizes example 39 of the present disclosure, wherein example 39 also includes the subject matter according to any one of examples 34-38, above.

The removal tool includes an annular tube and a vacuum. The preceding subject matter of this paragraph characterizes example 40 of the present disclosure, wherein example 40 also includes the subject matter according to any one of examples 34-38, above.

The described features, structures, advantages, and/or characteristics of the subject matter of the present disclosure may be combined in any suitable manner in one or more embodiments and/or implementations. In the following description, numerous specific details are provided to impart a thorough understanding of embodiments of the subject matter of the present disclosure. One skilled in the relevant art will recognize that the subject matter of the present disclosure may be practiced without one or more of the specific features, details, components, materials, and/or methods of a particular embodiment or implementation. In other instances, additional features and advantages may be recognized in certain embodiments and/or implementations that may not be present in all embodiments or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended claims, or may be learned by the practice of the subject matter as set forth hereinafter.

BRIEF DESCRIPTION OF THE DRAWINGS

In order that the advantages of the subject matter may be more readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the drawings, in which:

FIG. 11A depicts a substrate and removal tool, according to one or more embodiments of the present disclosure;

FIG. 11B depicts a substrate and removal tool, according to one or more embodiments of the present disclosure;

FIG. 11C depicts a substrate and removal tool, according to one or more embodiments of the present disclosure;

FIG. 11D depicts a substrate and removal tool, according to one or more embodiments of the present disclosure;

DETAILED DESCRIPTION

The protection of electronic devices is often a concern to consumers, particularly in view of the cost and extent to which consumers rely on state-of-the-art portable electronic devices. Water and other types of moisture and contamination can damage electronic devices. Protective coatings (or films) may be particularly useful for protecting portable electronic devices, such as cellular telephones, tablet computers, laptop computers, and other electronic devices, from accidental or incidental exposure to moisture. However, subcomponents of devices, such as ports, universal serial bus (USB) ports, proprietary ports, headphone jack receptacles, or other receptacles, openings or recesses may be adversely affected by a protective coating. Accordingly, masking materials may be used to cover subcomponents prior to applying a protective coating. After the protective coating is applied, the subcomponents may be de-masked to remove the making material, resulting in uncoated subcomponents.

Masking and de-masking processes may, in some cases, be time and labor intensive. In addition, repeatability and consistency in such processes are difficult to maintain. The subject matter of the present application has been developed in response to the present state of the art, and in particular, in response to the shortcomings of labor and time intensive manual masking and de-masking processes. According, the subject matter of the present application has been developed to provide automated processes and systems used for masking and de-masking of electronic components and subcomponents.

Other aspects, as well as features and advantages of various aspects, of the disclosed subject matter will be apparent to those of ordinary skill in the art through consideration of this disclosure and the appended claims.

Reference throughout this specification to "one embodiment," "an embodiment," or similar language means that a particular feature, structure, or characteristic described in connection with the embodiment is included in at least one embodiment of the present disclosure. Appearances of the phrases "in one embodiment," "in an embodiment," and similar language throughout this specification may, but do not necessarily, all refer to the same embodiment. Similarly, the use of the term "implementation" means an implementation having a particular feature, structure, or characteristic described in connection with one or more embodiments of the present disclosure, however, absent an express correlation to indicate otherwise, an implementation may be associated with one or more embodiments.

Automated Masking System and Process

Figure 1:
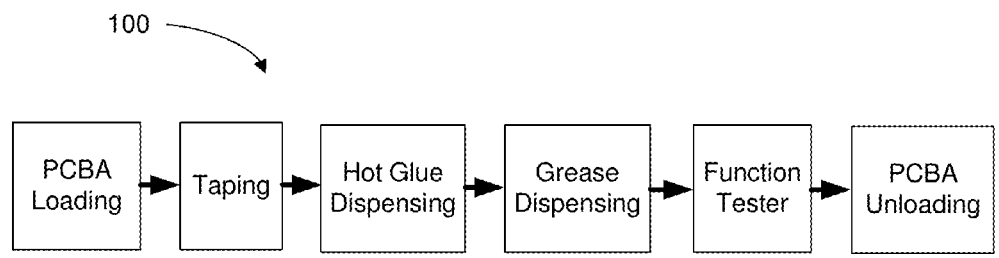
FIG. 1 is a schematic flow diagram of an automated masking process, according to one or more embodiments of the present disclosure.
Figure 2:
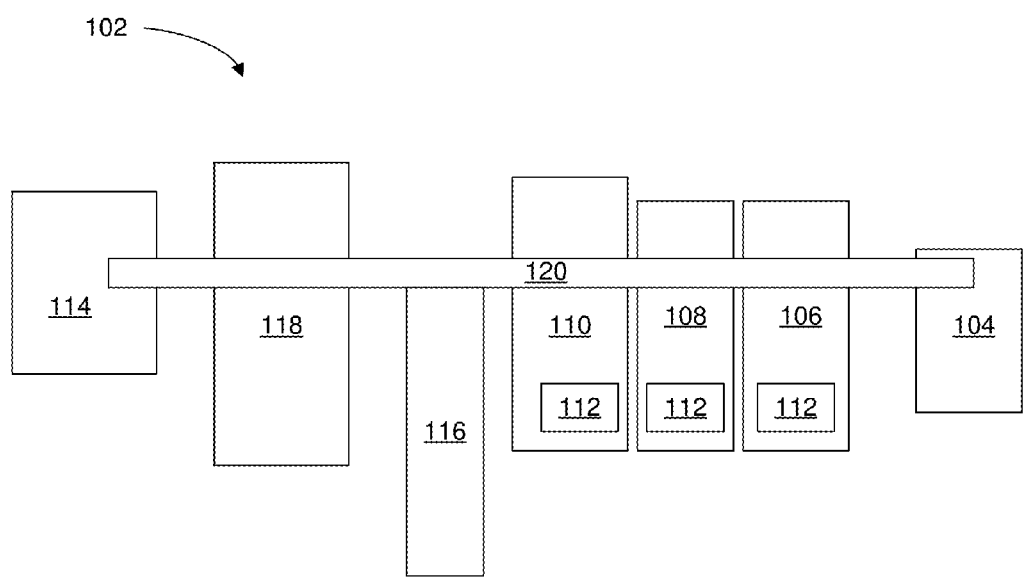
FIG. 2 is an automated masking system, according to one or more embodiments of the present disclosure.

FIGS. 1 and 2 illustrate embodiments of an automated masking process and system, respectively. More specifically, FIG. 1 is a schematic flow diagram of an automated masking process 100 and FIG. 2 is a schematic block diagram of an automated masking system 102. The process 100 includes loading printed circuit board assemblies ("PCBAs") into a loader or loading apparatus 104 of the system 102. Instead of a PCBA, in other embodiments, one or more of a substrate, an electrical device, an industrial device, a vehicular device, a precision mechanical device, a medical device, a scientific instrument, or the like, or a subcomponent of the like is loaded into the loader 104 of the system 102. The loading apparatus may be a rack, tray, stand support or frame configured to hold the substrates.

After being loaded, the PCBAs are automatically moved through one or more stations of the automated masking system 102. Some of the stations may be referred to as masking material application stations. In some embodiments, masking material application stations may include, for example, a tape dispensing station 106, a hot glue dispensing station 108, and a grease dispensing station 110. Each station may be a separate station and configured to apply a particular masking material including, but not limited to tape, glue, or grease. In some embodiments, the stations may be combined where a particular station is configured to apply more than one material.

The PCBAs may be moved by a conveyor apparatus 120, which may, for example, retrieve the PCBAs from the loader 104 and convey the PCBAs through the system 102. The conveyer apparatus may use any of various means to convey the PCBAs through the system 102, including belts, rollers, robotic arms, etc.

Initially, the PCBAs are automatically moved from the PCBA loader 104 to the tape dispensing station 106, where portions of the PCBAs are masked with tape from a tape dispensing apparatus. The tape may be any of a number of tapes including, for example, polyethylene tape and PVC tape. The tape dispensing apparatus is moved, relative to the PCBAs, via an X-Y table 112. The X-Y table 112 may be programmed to move in a repeatable motion, to provide accurate placement of a tape mask to the PCBAs.

Additionally, the PCBAs are automatically moved from the tape dispensing station 106 to the hot glue dispensing station 108 where portions of the PCBAs may be masked with hot glue. Hot glue or hot melt adhesive, such as low temperature hot glue, may be heated and then applied to a selected area of the PCBAs in such a way that the glue defines a mask over the selected area of the PCBAs. As the hot glue cools to ambient temperature, it hardens, and may be subsequently removed (e.g., by peeling, etc.) from the PCBAs at a desired time during a de-masking process. Glue may be useful in masking smaller components or features, such as electrical contacts of a subassembly of an electronic device. The hot glue dispensing station 108, in some implementations, is designed to accurately dispense hot glue on the PCBAs from a hot glue dispensing apparatus. The hot glue dispensing apparatus can be moved via an X-Y table 112 with accuracy within +/−0.002 mm. The X-Y table 112 may be programmed to move in a repeatable motion, to provide accurate placement of the hot glue on the PCBAs. The hot glue dispensing apparatus is configured to dispense any number of dots having any number of sizes, including a 1 mm dot, a 2 mm dot or a 0.5 mm dot. Other size dots are contemplated within the scope of this disclosure.

Additionally, the PCBAs are automatically moved from the hot glue dispensing station 108 to a grease dispensing station 110. In some embodiments, any of a number of grease-like materials may be used as masks, such as a grease (e.g., synthetic grease), a gel, a liquid masking agent, or any other suitable grease-like material that may be selectively applied to particular areas of the PCBAs to define a mask. Portions of the PCBAs are masked with a grease-like material from a grease dispensing apparatus of the grease dispensing station 110. The grease dispensing apparatus is moved, relative to the PCBAs, via an X-Y table 112. The X-Y table 112 may be programmed to move in a repeatable motion, to provide accurate placement of the grease-like material on the PCBAs.

After the PCBAs are masked they are automatically moved from the grease dispensing station 110 to a function tester. The function tester 118 inspects the PCBAs and tests functions of the PCBAs, or in some cases visually inspects the masks of the PCBAs. The function tester may be placed at any of various locations in the system including after each of one or more of the masking material application stations of the system 102. PCBAs that pass inspection are automatically moved to a PCBA receiver 114 for unloading. PCBAs that fail inspection are separated and are automatically moved to a failure magazine 116. The automated masking system 102 may include fewer or more features that perform fewer or more functions as described herein. In some embodiments, the order of the masking material application stations of the system 102 may be different. Moreover, in some embodiments, the automated masking system 102 may not include all of the masking material application stations described herein.

Features and subcomponents of the PCBAs may have varying geometries, sizes, locations, and functions, etc., which each may be conductive to application of a different masking material. For example, the PCBAs may have raised features which are more conducive to the application of a tape mask. Other features of the PCBAs may be small and inaccessible for a tape mask and may be more conductive to a grease mask or a hot glue mask. In addition, features of the PCBAs may be more conducive to the application of a particular masking material. The system 102 allows for the application of specific masking materials to specific components of the PCBAs in an automated and streamlined process. The system 102 also allows for repeatability in high volume masking processes.

While the system 102 is described with a particular number and order of masking material application stations, other embodiments, may include only one, two, three, or four, etc. masking material application stations in any order. Some embodiments include more masking material application stations than described herein, for example, if more masking materials are needed.

Automated System for Removing Bubbles from Tape Mask

Generally, FIGS. 3-7 depict an embodiment of an automated system and process for removing a bubble from a tape mask. As presented above with regards to FIGS. 1 and 2, tape can be used as a masking material. During an automated (or manual) application of tape onto a substrate, the applied tape may have imperfections such as a bubble formed in the tape. In order for the tape to function, the bubble should be removed prior to application of a coating to ensure the coating is not applied onto a feature of the substrate intended to be masked.

Figure 3:
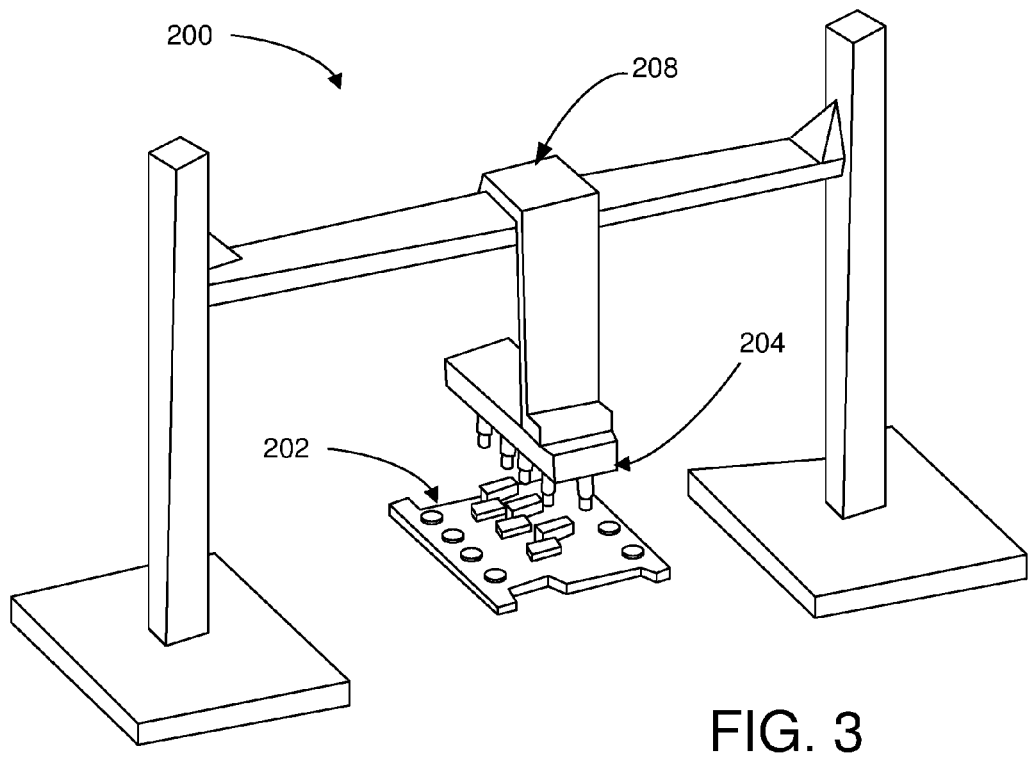
FIG. 3 is an automated system for removing a bubble from an applied tape, according to one or more embodiments of the present disclosure.
Figure 4:
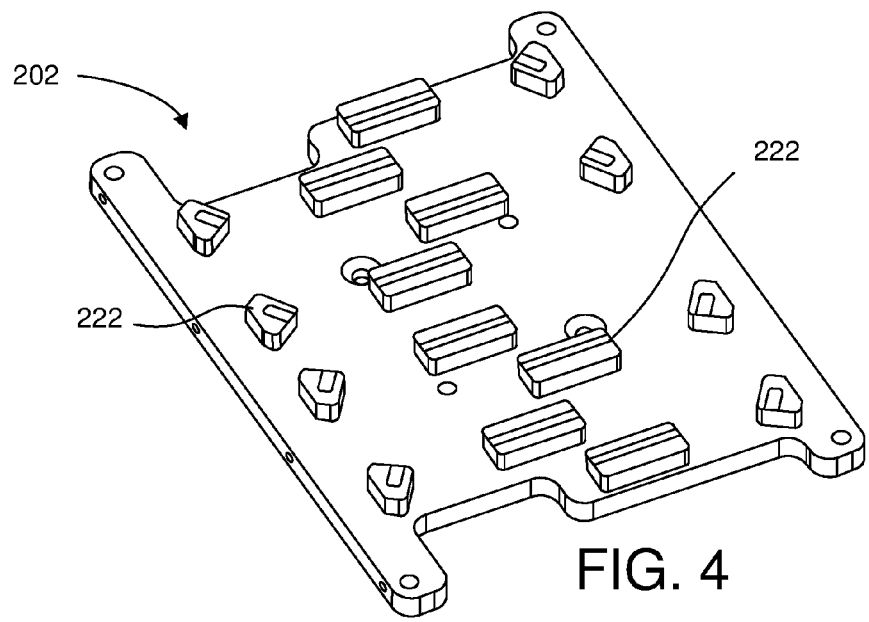
FIG. 4 is a fixture for the automated system, according to one or more embodiments of the present disclosure.
Figure 5:
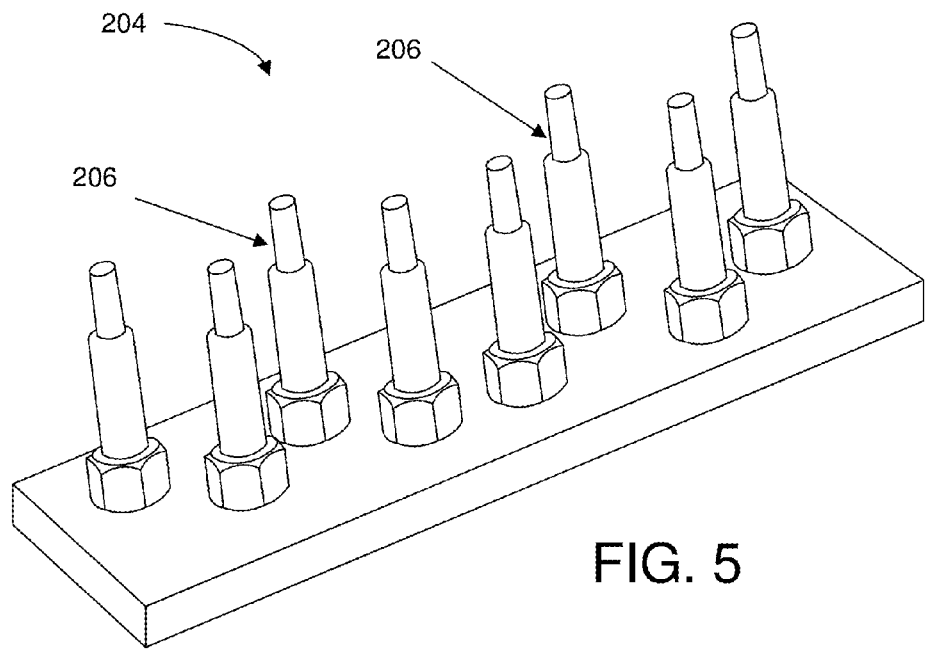
FIG. 5 is a press tool apparatus, according to one or more embodiments of the present disclosure.

Referring to FIG. 3, an embodiment of an automated system 200 for removing a bubble from an applied tape is shown. The automated system 200 includes a fixture 202 designed to hold in place a substrate 216 (see e.g., FIG. 7). The substrate can be an electrical device, an industrial device, a vehicular device, a precision mechanical device, a medical device, a scientific instrument, or the like, or a subcomponent of the like. The substrate 216 includes tape 214 applied onto a masked feature 218 of the substrate 216 (see, e.g., FIG. 7). As shown in FIG. 4, the fixture 202 includes features 222 designed to support and hold the substrate 216 from the back side of the substrate 216. The fixture 202 and the features 222 may be designed to accommodate the unique features of a given substrate 216.

Referring back to FIG. 3, the automated system 200 also includes a robotic movable arm 208 capable of moving a press tool apparatus 204 relative to the fixture 202 and a corresponding substrate 216 supported by the fixture 202. The press tool apparatus 204 includes a plurality of press tools 206 (see, e.g., FIG. 5). The position of the press tools 206 on the press tool apparatus 204 may be designed to complement the location of applied tape 214 on the substrate 216.

Figure 6:
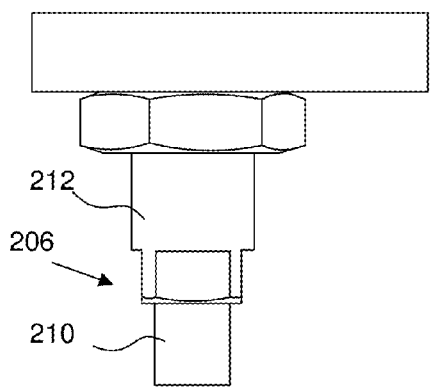
FIG. 6 is a press tool, according to one or more embodiments of the present disclosure.
Figure 7:
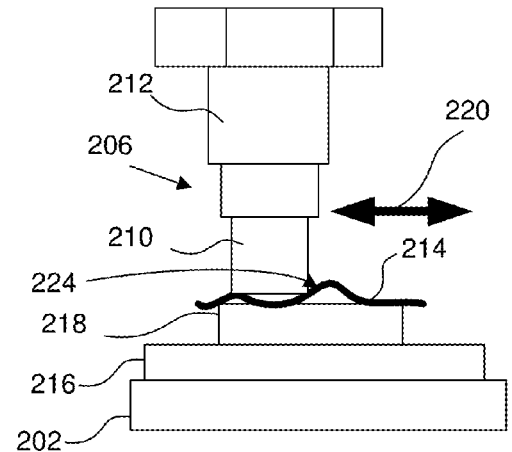
FIG. 7 depicts a motion of the press tool relative to a tape mask, according to one or more embodiments of the present disclosure.

As shown in FIGS. 6 and 7, the press tool 206 includes a flexible head 210 and a buffer structure 212. The flexible head 210 is designed to contact and press the tape to the substrate without damaging the substrate. The flexible head 210 may be made of rubber or other compliant material that is flexible. The shape and dimensions of the flexible head 210 may be designed to complement the shape and dimensions of the features 218 of the substrate 216.

The buffer structure 212 includes an internal spring to allow the flexible head 210 to move when pressed into the substrate, further protecting the substrate from damage. The internal spring (or other biasing mechanism) biases the flexible head 210 to press into the features 218 of the substrate 216 and smooth the tape 214.

During operation of the system 200, the fixture 202 and substrate 216 are moved into a position below the press tool apparatus 204. The arm 208 moves relative to the substrate 216 and presses the press tools 206 onto the substrate 216 at the features 218 with tape 214 applied thereon. The arm 208 may move press tool apparatus 204 across the tape 214 in a direction transverse the substrate, depicted by arrows 220 (see FIG. 7), allowing the flexible heads 210 to press the tape 214 to the masked features 218 and remove formed bubbles 224 and other imperfections from the tape 214. In some embodiments, the automated system 200 may be part of the automated masking system 102 and may be located, for example, after the tape dispensing station 106.

Automated System for Removing Masking Material

FIGS. 8-11 illustrate embodiments of a masking material removal system 300. Masking materials are placed on features of substrates before a protective coating or film is applied onto the substrate. After the application of the protective coating, the masking materials are removed from the substrate to expose the features. As mentioned above, a typical removal process can be time consuming and labor intensive.

Figure 8:
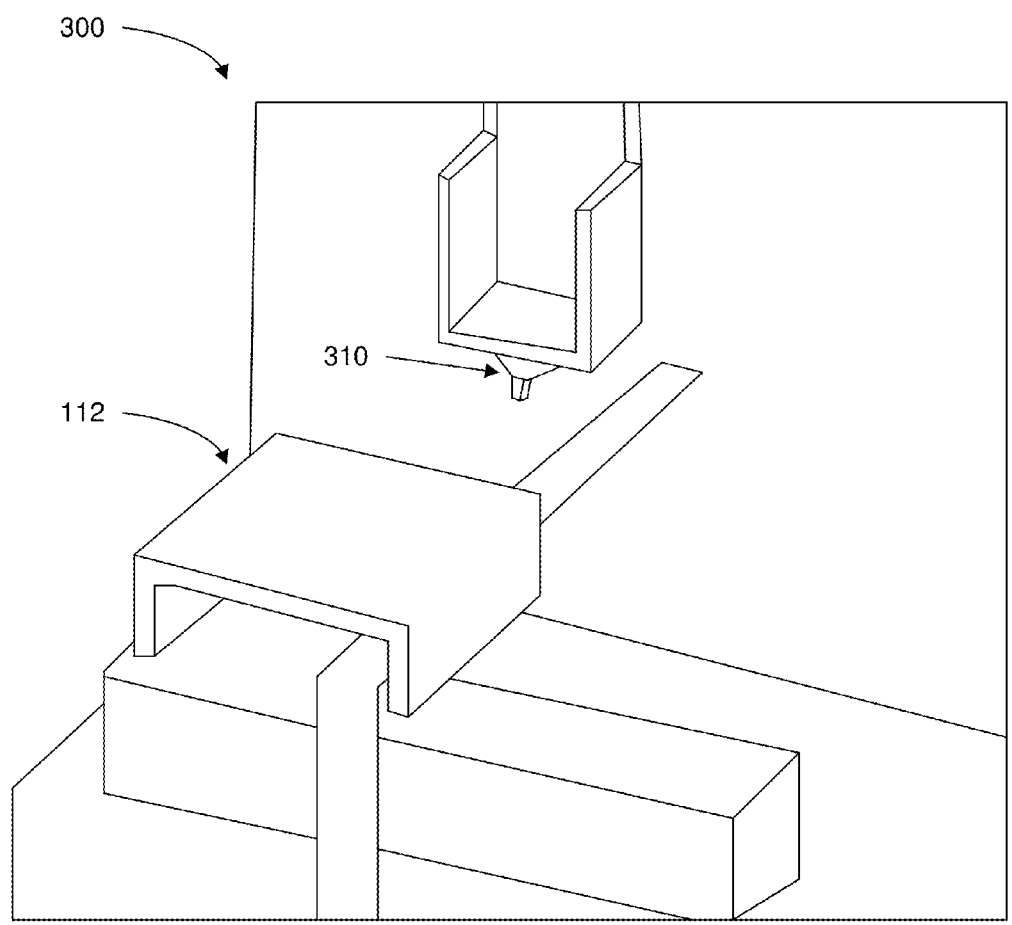
FIG. 8 depicts a system for removing masking material, according to one or more embodiments of the present disclosure.

Referring to FIG. 8, one embodiment a system 300 for removing masking material is shown. The system 300 includes a fixture designed to hold a substrate 302 (see, e.g., FIG. 9). The substrate 302 includes a masking material 304, such as in the form of a dot of masking material, located on a top and bottom surface of the substrate 302. The fixture may be designed to hold the substrate 302 while exposing both the top and bottom of an edge of the substrate 302 exposing masking material 304 on the top and bottom of the substrate 302 (see, e.g., FIGS. 9 and 10).

Figure 9:
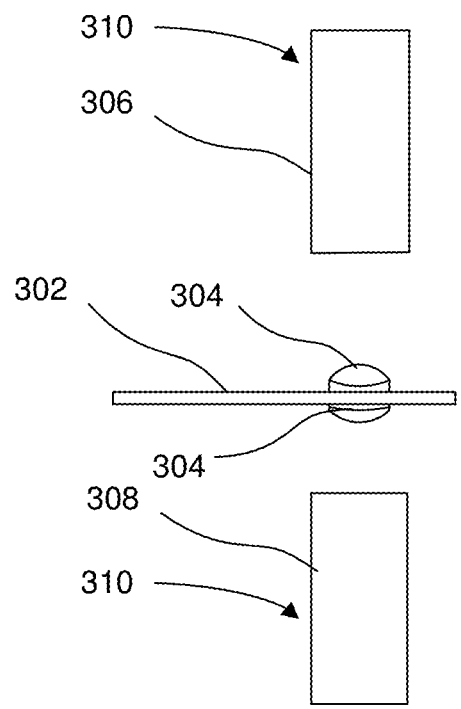
FIG. 9 depicts a substrate and removal tool, according to one or more embodiments of the present disclosure.
Figure 10:
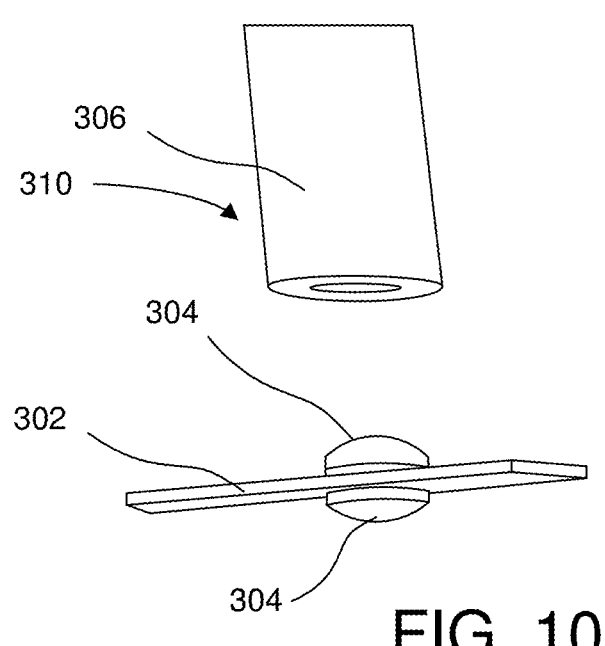
FIG. 10 depicts a substrate and removal tool, according to one or more embodiments of the present disclosure.
Figure 12:
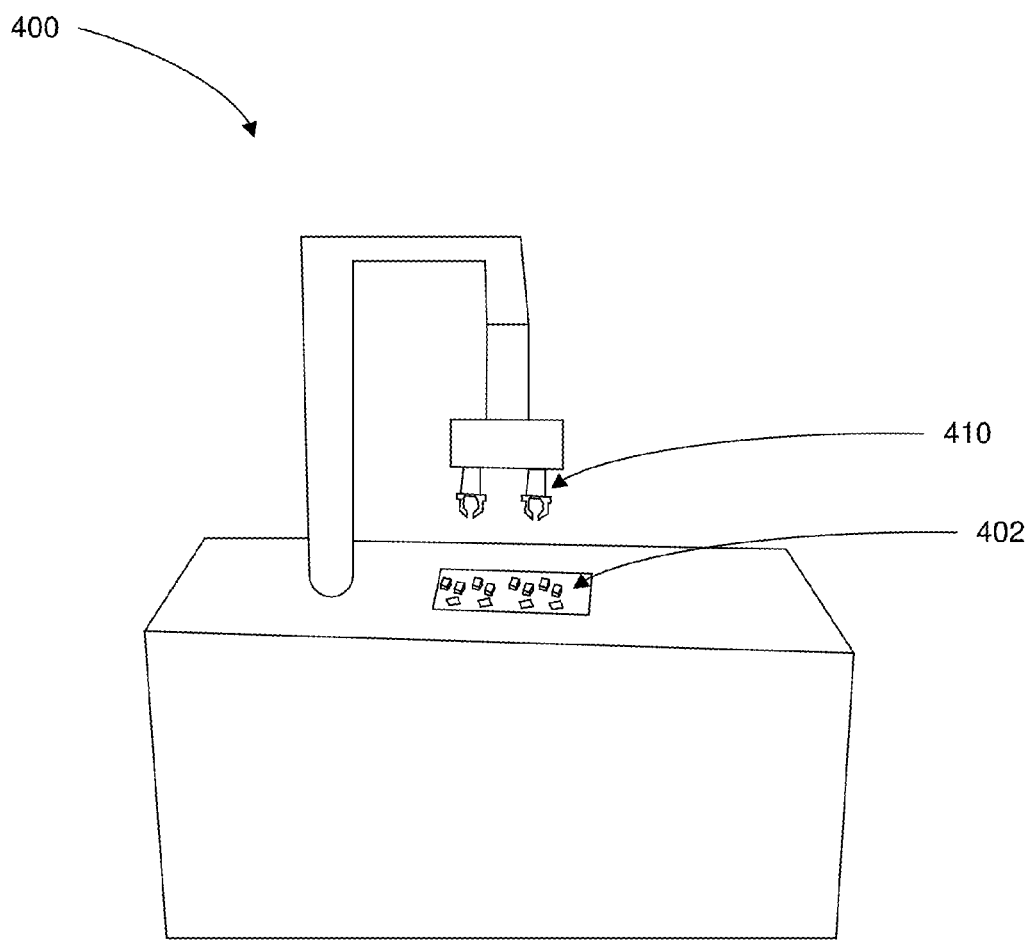
FIG. 12 depicts a system for removing masking material, according to one or more embodiments of the present disclosure.

Various, interchangeable, removal tools 310 may be used in conjunction with the system 300. For example, FIGS. 9-11 illustrate several embodiments of a removal tool 310 for removing masking material 304. The system 300 moves the removal tool 310 relative to the substrate 302. The removal tool 310 engages the masking material 304 and removes the masking material 304 from the substrate 302 through, for example, mechanical means.

In the embodiment of FIG. 9, the removal tool 310 of the system 300 includes an upper annular tube 306 and a lower annular tube 308 coaxially aligned with the upper annular tube 306. The annular tubes 306, 308 move relative to the substrate 302. The annular tubes 306, 308 align with the masking material 304, with the masking material 304 being interposed between the annular tubes 306, 308. The upper annular tube 306 is configured to remove the masking material 304 from the designated feature of the substrate 302. Moreover, the upper annular tube 306 may remove the masking material 304 through mechanical means, including applied forces, shearing forces, compressive forces, suction forces, etc., chemical means, or precise heating means. In some embodiments, the removal tool 310 includes a heating element for heating the masking material 304. Heating the masking material 304 may provide for easier removal of the masking material 304 from the substrate 302. In some embodiments, the heating element may be attached to the annular tube 306, the annular tube 308, or both. In other embodiments, the heating element is a subcomponent of the removal tool 310 separate from the annular tubes 306, 308.

In some embodiments, the coating or film surrounding the masking material 304 is cut to allow for the removal of the masking material 304. The lower annular tube 308 and/or the upper annular tube 306 is/are connected to a vacuum (not shown) that sucks the masking material 304 away from the substrate 302 after removal from the substrate 302. FIG. 10 illustrates an embodiment of a removal tool 310 of the system 300 similar to that in FIG. 9, except the removal tool 310 includes only an upper annular tube 306.

Referring to FIG. 11, various embodiments of removal tools 310 are shown. Generally, each embodiment has a differently configured removal tool 310 that moves relative to and applies forces to the masking material 304 in different manners.

In a first example, as shown in FIG. 11A, the removal tool 310 includes an upper blade 312 and a lower blade 314 aligned, or otherwise coplanar, with the upper blade 314. The substrate 302 is positioned next to the lower blade 314 and the upper blade 312 may be actuated into place, for example, up and down as indicated by arrows 316. The lower blade 314 and the upper blade 312 may move to position adjacent the substrate 302, proximate to the masking material 304.

In a second example, as shown in FIG. 11B, the upper blade 312 and the lower blade 314 of the removal tool 310 may both be actuated into place, for example, in a pinching motion as indicated by arrows 318. Once in place, the upper blade 312 and the lower blade 314 may scrape masking material 304 from the substrate 302.

Referring to FIG. 11C, the upper blade 312 and the lower blade 314 have beveled edges. The beveled edge of the upper blade 312 and the beveled edge of the lower blade 314 may be used to apply a shearing force to scrape the masking material 304 from the substrate 302 as the upper blade and lower blades 312, 314 move in a direction indicated by arrows 320.

Referring to FIG. 11D, the upper blade 312 and the lower blade 314 engage the masking material 304 and apply a compressive force as the blades 312, 314 move as indicated by arrows 322. The upper blade 312 and the lower blade 314 include hard rubber edges to squeeze the masking material 304 before shearing the masking material 304 off the substrate as the upper blade 312 and the lower blade 314 move in a direction indicated by arrows 324. The upper blade 312 and the lower blade 314 can be textured, hollowed, shaped, or roughened to facilitate gripping of the masking material 304.

FIGS. 12-19 depict another embodiment of a masking material removal system 400. The system 400 includes a fixture 402 designed to hold a substrate. The system 400 further includes a removal tool 410 that moves relative to the substrate.

Figure 13:
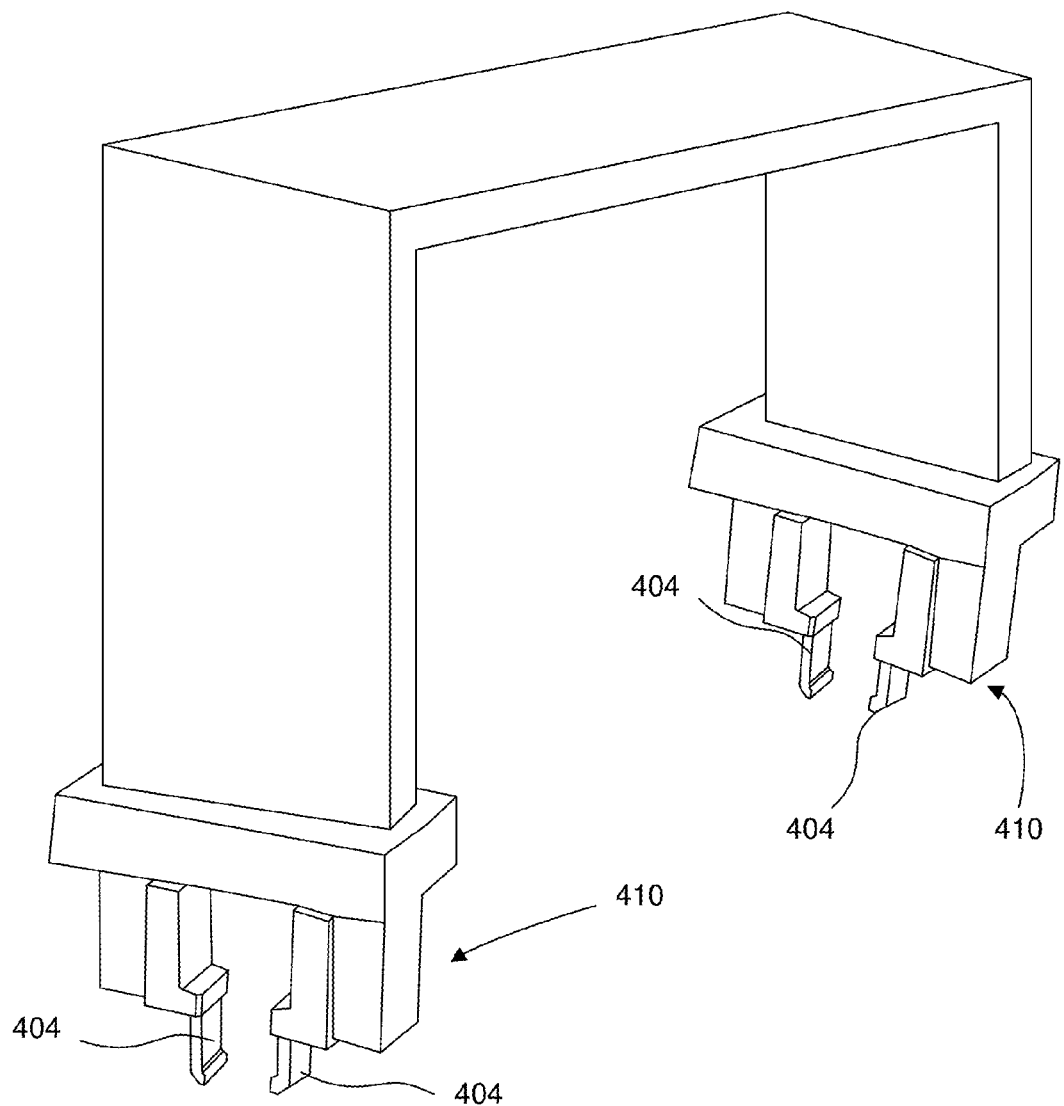
FIG. 13 depicts removal tools, according to one or more embodiments of the present disclosure.
Figure 14:
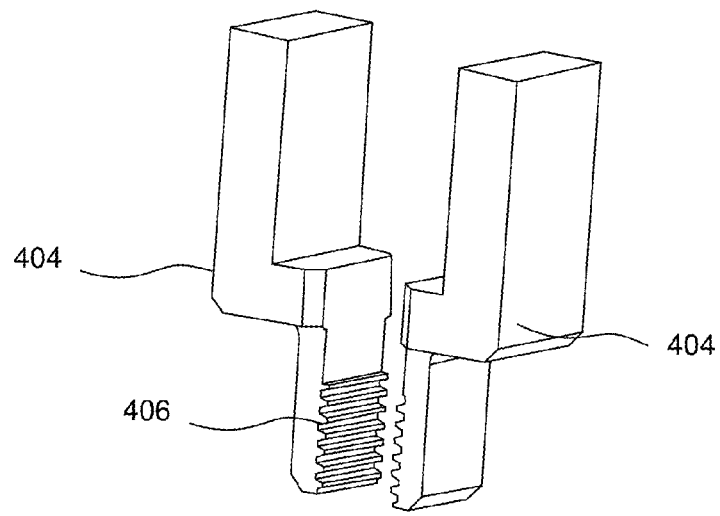
FIG. 14 depicts a removal tool, according to one or more embodiments of the present disclosure.
Figures 15, 16:
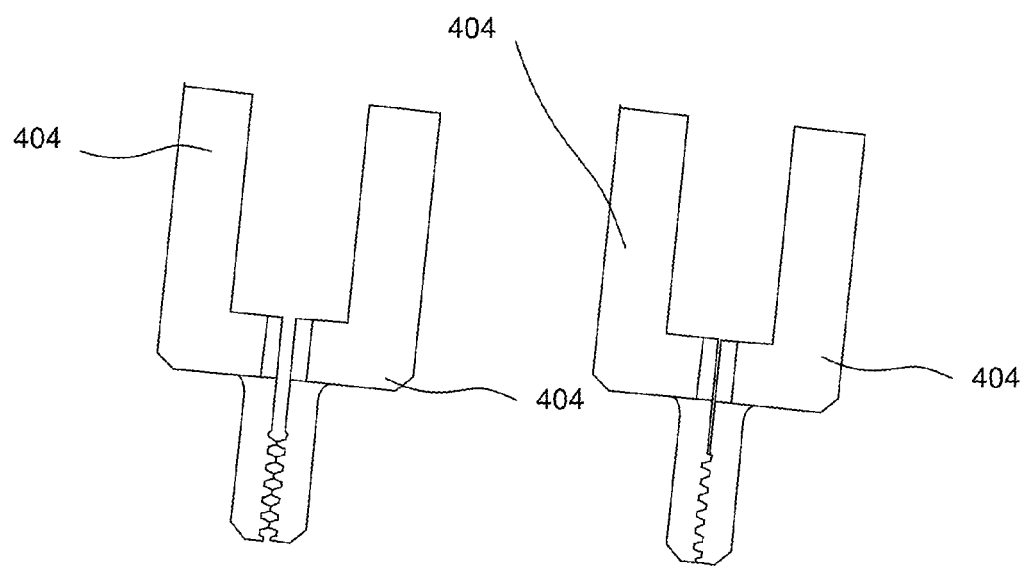
FIG. 15 depicts a removal tool, according to one or more embodiments of the present disclosure.
FIG. 16 depicts a removal tool, according to one or more embodiments of the present disclosure.
Figure 17:
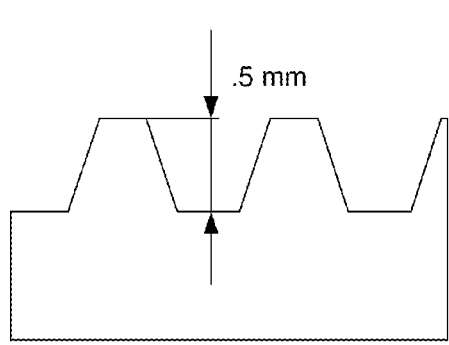
FIGS. 17-19 depict teeth of a removal tool, according to one or more embodiments of the present disclosure.
Figure 18:
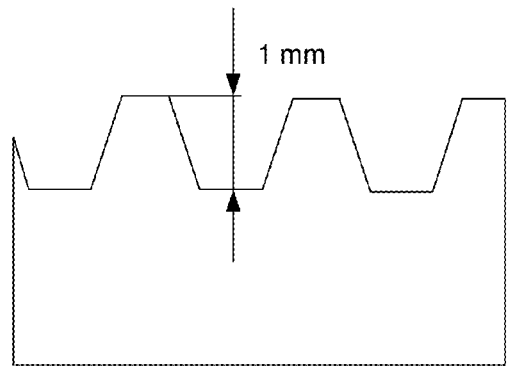

Referring to FIG. 13, the removal tool 410 includes a pair of opposing fingers 404 designed to pinch together and remove masking material from one side of a substrate. The fingers 404 each include a plurality of teeth 406 extending longitudinally across a face of the finger 404. The teeth 406 of one finger 404 are designed to engage the teeth 406 of the opposing finger 404 when the fingers 404 are pinched together (see, e.g., FIGS. 15 and 16). Referring to FIG. 15, in some embodiments, the teeth 406 of opposing fingers 404 may be aligned. In contrast, referring to FIG. 16, in some embodiments, the teeth 406 of opposing fingers 404 may be offset. In some embodiments, the fingers 404 are configured to pinch the contour of the masking material prior to grabbing and removing the masking material.

In some cases, the masking material may stick to or otherwise become lodged in the teeth 406 of the fingers 404 after removal of the masking material from the substrate. Some embodiments of the system 400 include a brush or other implement for removing masking material from the teeth 406 of the fingers 404. The brush or other implement may selectively engage any teeth 406 with excess masking material to brush, wipe, or scrape, etc. the masking material from the teeth 406.

The fingers 404 may be made of any of various materials, such as metals, for example, steel. In one embodiment, the each finger 404 is made of ASTM-1045 steel with a Rockwell C hardness of approximately 50 to 62. In one embodiment, the fingers 404 are made of A3 steel. The surface of each finger 404 can be chrome plated to increase wear resistance to a Vickers hardness of greater than 700 HV.

Figure 19:
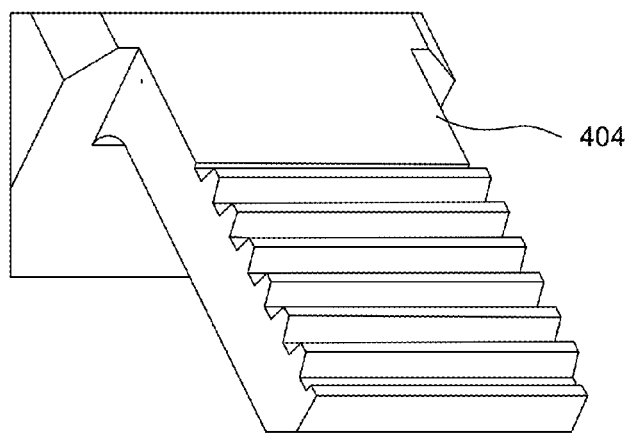

In some embodiments, the teeth are specifically dimensioned. For example, the depth of the teeth 406 may be 0.5 mm (see, e.g., FIG. 17). In another embodiment, the depth of the teeth 406 may be 1.0 mm (see, e.g., FIG. 18). In some embodiments, the depth of the teeth may be between 0.5 mm and 2.0 mm. Larger tooth depths, such as shown, may provide increased space for hot glue or other masking materials to locate during the removal process. Referring to FIG. 19, in one embodiment, the teeth 406 may be approximately 6 mm in width. In other embodiments, the width of the teeth may be any of a number of dimensions including ranging from 2 mm to 10 mm. The width and depth of the teeth 406 may be designed to the particular needs of a substrate and the size and geometry of the masking materials applied onto the substrate.

Although the foregoing disclosure provides many specifics, these should not be construed as limiting the scope of any of the ensuing claims. Other embodiments may be devised which do not depart from the scopes of the claims. Features from different embodiments may be employed in combination. The scope of each claim is, therefore, indicated and limited only by its plain language and the full scope of available legal equivalents to its elements.

Reference throughout this specification to features, advantages, or similar language does not imply that all of the features and advantages that may be realized with the subject matter of the present disclosure should be or are in any single embodiment. Rather, language referring to the features and advantages is understood to mean that a specific feature, advantage, or characteristic described in connection with an embodiment is included in at least one embodiment of the present disclosure. Thus, discussion of the features and advantages, and similar language, throughout this specification may, but do not necessarily, refer to the same embodiment.

In the above description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object. Further, the terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

As used herein, the phrase "at least one of", when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required. For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

As used herein, a system, apparatus, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

The present subject matter may be embodied in other specific forms without departing from its spirit or essential characteristics. The described embodiments are to be considered in all respects only as illustrative and not restrictive.

What is claimed:

1. An automated masking system, comprising:
   a substrate loading apparatus designed to hold one or more substrates;
   a first masking material application station designed to automatically apply a first masking material to a portion of the one or more substrates, wherein the first masking material application station comprises a first dispensing apparatus that moves relative to the one or more substrates in a repeatable motion; and
   a second masking material application station designed to automatically apply a second masking material to a portion of the one or more substrates, the second masking material being different than the first masking material, wherein the second masking material application station comprises a second dispensing apparatus that moves relative to the one or more substrates in a repeatable motion, wherein the one or more substrates moves automatically from the first masking material application station to the second masking material application station.

2. The automated masking system of claim 1, wherein the first dispensing apparatus dispenses a tape.

3. The automated masking system of claim 2, wherein the second dispensing apparatus dispenses a hot glue.

4. The automated masking system of claim 1, wherein the first dispensing apparatus dispenses a grease.

5. The automated masking system of claim 1, wherein the first dispensing apparatus moves relative to the one or more substrates in a repeatable motion via an X-Y table.

6. The automated masking system of claim 1, further comprising a conveyor apparatus configured to automatically move the one or more substrates from the first masking material application station to the second masking material application station after application of the first masking material to the portion of the one or more substrates.

7. The automated masking system of claim 1, further comprising a function tester configured to inspect the one or more substrates.

8. The automated masking system of claim 1, wherein the second dispensing apparatus moves relative to the one or more substrates in a repeatable motion via an X-Y table.

9. An automated masking method, comprising:
   loading one or more substrates into a loading apparatus;
   automatically moving the one or more substrates from the loading apparatus to a first masking material application station;
   applying a first masking material to the one or more substrates from a first dispensing apparatus that moves relative to the one or more substrates in a repeatable motion;
   automatically moving the one or more substrates from the first masking material application station to a second masking material application station; and
   applying a second masking material to the one or more substrates from a second dispensing apparatus that moves relative to the one or more substrates in a repeatable motion.

10. The automated masking method of claim 9, further comprising inspecting the one or more substrates after applying the first masking material and the second masking material.

11. The automated masking method of claim 9, wherein the first dispensing apparatus moves relative to the one or more substrates in a repeatable motion programmed into an X-Y table.

12. The automated masking method of claim 9, wherein the second dispensing apparatus moves relative to the one or more substrates in a repeatable motion programmed into an X-Y table.

13. The automated masking method of claim 9, wherein applying the first masking material to the one or more substrates from the first dispensing apparatus that moves relative to the one or more substrates in the repeatable motion comprises applying a tape.

14. The automated masking method of claim 9, wherein applying the first masking material to the one or more substrates from the first dispensing apparatus that moves relative to the one or more substrates in the repeatable motion comprises applying a hot glue.

15. The automated masking method of claim 9, wherein applying the first masking material to the one or more substrates from the first dispensing apparatus that moves relative to the one or more substrates in the repeatable motion comprises applying a grease.

* * * * *